(12) United States Patent
Blunno et al.

(10) Patent No.: US 7,500,216 B1
(45) Date of Patent: Mar. 3, 2009

(54) METHOD AND APPARATUS FOR PERFORMING PHYSICAL SYNTHESIS HILL-CLIMBING ON MULTI-PROCESSOR MACHINES

(75) Inventors: Ivan Blunno, Woodbridge (CA); Gordon Raymond Chiu, Richmond Hill (CA); Deshanand Singh, Mississauga (CA); Valavan Manohararajah, Scarbough (CA); Stephen D. Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 197 days.

(21) Appl. No.: 11/703,372

(22) Filed: Feb. 7, 2007

(51) Int. Cl.
*G06F 17/50* (2006.01)

(52) U.S. Cl. .............................................. 716/18; 716/2

(58) Field of Classification Search ...................... None
See application file for complete search history.

(56) References Cited

U.S. PATENT DOCUMENTS 6,996,550 B2 * 2/2006 Wang et al. ................... 706/19
7,092,838 B1 * 8/2006 Srinivas et al. .............. 702/117

\* cited by examiner

*Primary Examiner*—Leigh Marie Garbowski
(74) *Attorney, Agent, or Firm*—L. Cho

(57) ABSTRACT

A method for designing a system on a target device includes synthesizing the system. The system is mapped. The system is placed on the target device. The system is routed. Physical synthesis is performed on the system where a first descendant thread is spawned to run in parallel with an existing thread where the first descendant thread is executing a different optimization strategy than the existing thread but on a same netlist as the existing thread.

27 Claims, 16 Drawing Sheets

… (1)

METHOD AND APPARATUS FOR PERFORMING PHYSICAL SYNTHESIS HILL-CLIMBING ON MULTI-PROCESSOR MACHINES

TECHNICAL FIELD

Embodiments of the present invention relate to tools such as electronic design automation (EDA) tools for designing systems on application specific integrated circuits (ASICs) and field programmable gate arrays (FPGAs). More specifically, embodiments of the present invention relates to a method and apparatus for performing multiple stage physical synthesis using EDA tools.

BACKGROUND

ASICs and FPGAs are used to implement large systems that include million of gates and megabits of embedded memory. The complexity of large systems often requires the use of EDA tools to create and optimize a design for the system onto physical target devices. Among the procedures performed by EDA tools in a computer aided design (CAD) flow are synthesis, technology mapping, clustering, placement, and routing.

In the past, physical synthesis was optionally used to perform a series of circuit transformations to optimize the design of the system. Physical synthesis would typically be performed at a single point after placement and before routing to improve the delays on connections to be routed. Estimates of interconnect delay obtained from existing placement could be used to guide physical synthesis transformations that restructure the circuit on or near a critical path. Unlike traditional synthesis, physical synthesis may take into account the technology and architecture of the target device and delays associated with signals on the target device while performing the circuit transformations to optimize the design of the system.

Hill-climbing is an optimization technique which may be used in physical synthesis. Hill-climbing attempts to maximize (or minimize) a function f(x), where x are discrete states. These states are typically represented by vertices in a graph, where edges in the graph encode nearness or similarity of a graph. Hill-climbing will follow the graph from vertex to vertex, always locally increasing (or decreasing) the value of f, until a local maximum $x_m$ is reached. Hill-climbing has proven to be highly beneficial in improving the quality of optimization results. However, when performing hill-climbing, a large amount of time may be spent performing iterations that may turn out to be useless when an old, better solution is restored.

Thus, what is needed is an efficient and effective method and apparatus for performing hill-climbing in applications such as physical synthesis.

SUMMARY

According to an embodiment of the present invention, branch prediction is used to reduce time wasted in hill-climbing iterations in a design flow of systems on an FPGA. Prior to completing an iteration of optimization, one or more additional threads may be spawned to perform an iteration of optimization using a different strategy. The results from using a different strategy may be used in the event the current hill-climbing iteration fails. By allocating additional threads to perform iterations of optimizations using different strategies concurrently and in parallel with an existing thread, time that would have otherwise been wasted generating an un- usable solution performing serial hill-climbing could be used to generate a useable solution and reduce the overall compile time.

According to an aspect of the present invention, a cost function that takes into account an expected compile time reduction is used to determine whether to spawn an additional thread. The expected compile time reduction may be generated from a probability of success for an iteration using an optimization strategy of the existing thread, an estimated time to execute an iteration using an optimization strategy of the existing thread, a number of iterations remaining to be performed by the existing thread, a remaining number of hill-climbing iterations allowable for the existing thread, and/or other information.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
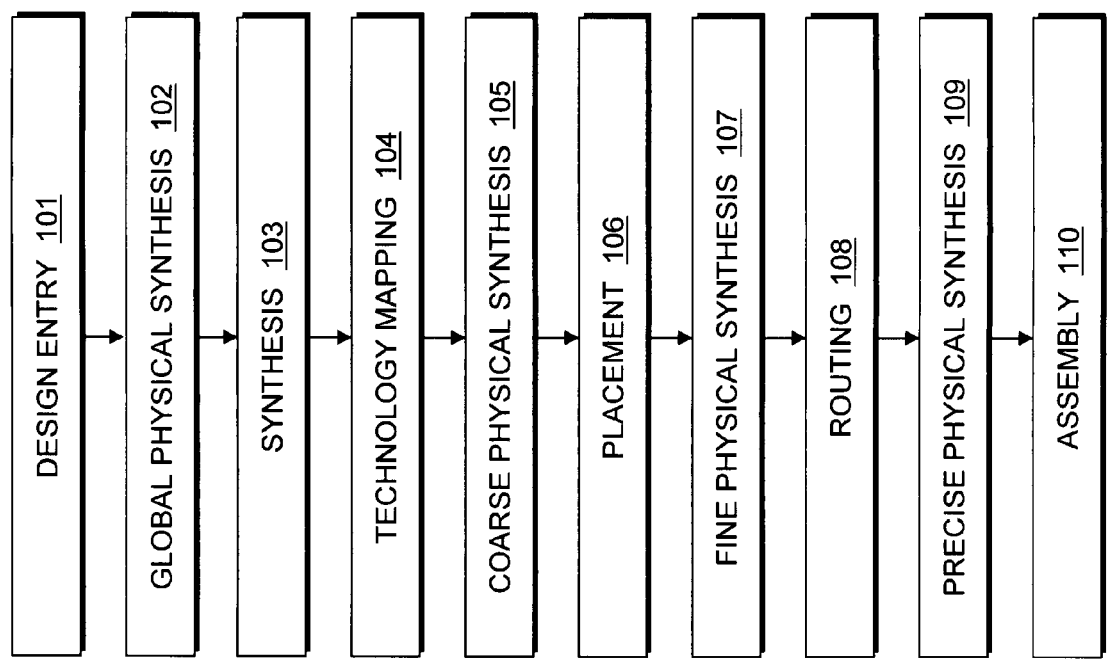
FIG. 1 is a flow chart illustrating a method for designing a system on a target device according to an exemplary embodiment of the present invention.

FIG. 1 is a flow chart illustrating a method for designing a system on a target device according to an embodiment of the present invention. At 101, a design for the system is entered into a design tool. The design may be described at a gate level or in a more abstract level. The design may be described in terms of a hardware description language (HDL) such as VHDL or Verilog. The target device may be an ASIC, structured ASIC, FPGA, programmable logic device (PLD), or other target device.

At 102, global physical synthesis is performed.

At 103, the system is synthesized. Synthesis includes generating a logic design of the system to be implemented. According to an embodiment of the present invention, synthesis generates an optimized logical representation of the system from a HDL design definition. The optimized logical representation of the system may include a representation that has a minimized number of functional blocks and registers, such as logic gates and logic elements, required for the system.

At 104, technology mapping is performed on the optimized logic design. Technology mapping includes determining how to implement logic gates and logic elements in the optimized logic representation with resources (components) available on the target device. According to an embodiment of the present invention, a netlist is generated from mapping. This netlist may be an optimized technology-mapped netlist generated from the HDL.

At 105, coarse physical synthesis is performed.

At 106, the mapped logical system design is placed. Placement works on the optimized technology-mapped netlist to produce a placement for each of the functional blocks. According to an embodiment of the present invention for a target device that is a structured ASIC, placement includes fitting the system on the target device by determining which components on the logic design are to be used for specific logic elements, and other function blocks. Placement may include clustering which involves grouping logic elements together to form the logic clusters present on the target device.

At 107, fine physical synthesis is performed.

At 108, it is determined which routing resources should be used to connect the components in the logic design implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 109, precise physical synthesis is performed.

At 110, an assembly procedure is performed. The assembly procedure involves creating a data file that includes information determined and/or results generated by the procedure described by 101-109. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Physical synthesis is illustrated in FIG. 1 at four stages in the design flow (immediately after design entry at 102, immediately after technology mapping at 105, immediately after placement at 107, and immediately after routing at 109). It should be appreciated that not all four of the stages are required to be utilized in designing a system on a target device, that additional stages of physical synthesis may be implemented, that physical synthesis may be implemented at stages other than the stages that are shown, and that physical synthesis may be performed within one or more of the procedures 101, 103, 104, 106 and/or 108. For example, according to an embodiment of the present invention, physical synthesis may be performed within the placement procedure 106 between placement and clustering. According to an embodiment of the present invention, physical synthesis includes a series of circuit transformations to optimize the circuit for a given goal. The circuit transformations occur outside the stage of design entry, synthesis, technology mapping, placement, and routing. Physical synthesis may be used to optimize a circuit for goals such as reducing a delay of a signal transmitted on a circuit, reduction of an area required for implementing the circuit on a target device, reducing the amount of power required for operating the circuit or the system, improving the routability of the circuit, and/or other goals.

Physical synthesis may be used to perform a series of circuit transformations to optimize a circuit in a system such that a delay of a signal in the system is reduced. Most of the delays in an FPGA circuit are due to the programmable routing network. These delays cannot be determined with great certainty until routing is completed. The traditional logic synthesis procedure at 103 is responsible for creating a circuit implementation that will realize the functionality of a designer's hardware specification. At this early stage of the design flow it is difficult to predict the delays of routed connections. It is for this reason that traditional logic synthesis may create circuit structures that are sub-optimal in terms of critical path performance. By performing physical synthesis at later stages of the design flow, better estimations of routed delays may be predicted and used to perform optimizations to reduce the delays.

Physical synthesis may be used to perform a series of circuit transformations to optimize a circuit in a system such that the area required on the target device for the circuit is reduced. The amount of area required to implement a circuit on an FPGA is known after technology mapping, when the circuit is mapped from a generic technology independent gate-level netlist representation to specific combinatorial and registered elements. Prior to the technology mapping procedure 104 of the design flow, it is difficult to predict the final area requirement of the circuit. It is for this reason that traditional logic synthesis may choose, in the interest of other cost metrics such as performance, an implementation for a circuit that is sub-optimal in terms of area. By performing physical synthesis after technology mapping 104, information regarding the area required to implement the circuit is available. Several techniques of optimizing the circuit structure to improve area may be employed during physical synthesis including mapping over-used resources (such as combinational lookup tables) to unused resources (such as memories).

Physical synthesis may be used to perform a series of circuit transformation to optimize a circuit in a system such that the power required to operate the system is improved. For example, physical synthesis may reduce the wirelength and thus capacitance of signals with a high toggle rate. Physical synthesis may also use programmable inverters to bias the distribution of high and low signals when one signals utilizes less power than others. Performing physical synthesis after the technology mapping procedure 104 of the design flow is well suited to reduce the amount of dynamic power consumed by the system. Signals with a high toggle rate can be identified and moved forward through the cone of logic so that fewer levels of logic toggle. Performing physical synthesis after routing can further reduce power consumption by identifying routing connections which glitch and insert registered logic to filter these glitches.

Physical synthesis may be used to perform a series of circuit transformation to optimize a circuit in a system to improve the routability of the system. For most circuits, the final routing connections chosen are very close to the optimal, shortest connections available for the given placement. A subset of designs are considered difficult to route, for which it may not be possible to find a legal route, or find a routing that preserves the performance of the circuit. Optimizing for routability may entail reducing the total wirelength usage of the circuit and reducing the contention for highly used and often congested wired segments. Physical synthesis performed prior to placement benefit from having high flexibility. Physical synthesis performed after placement benefit from having access to accurate prediction of wirelength is available and estimates can be made of probable congestion.

According to an embodiment of the present invention, the physical synthesis stages 102, 105, 107, and 109 shown in FIG. 1 may change their behavior according to the results and stages of previous stages in the design flow. According to one aspect of this embodiment, state information is passed between each stage of physical synthesis. This allows each stage of physical synthesis to adapt and changes its behavior in response to the quality of estimations and the actions performed by a previous physical synthesis stage. For example, when a later physical synthesis stage discovers that a previous stage performed optimizations using an inaccurate prediction, additional optimizations in the current physical synthesis stage may be performed. The additional optimizations may be performed with more accurate predictions that improve the circuit. On the other hand, when an earlier physical synthesis stage is determined to have made an accurate prediction and a subsequent physical synthesis stage recognizes that any optimizations it performs will be using the same prediction, it may determine not to perform an unnecessary optimization to reduce compile time. It should be appreciated that state information from a stage of physical synthesis may be left to any other stage of physical synthesis to be used in a subsequent iteration of the design flow.

Figure 2:
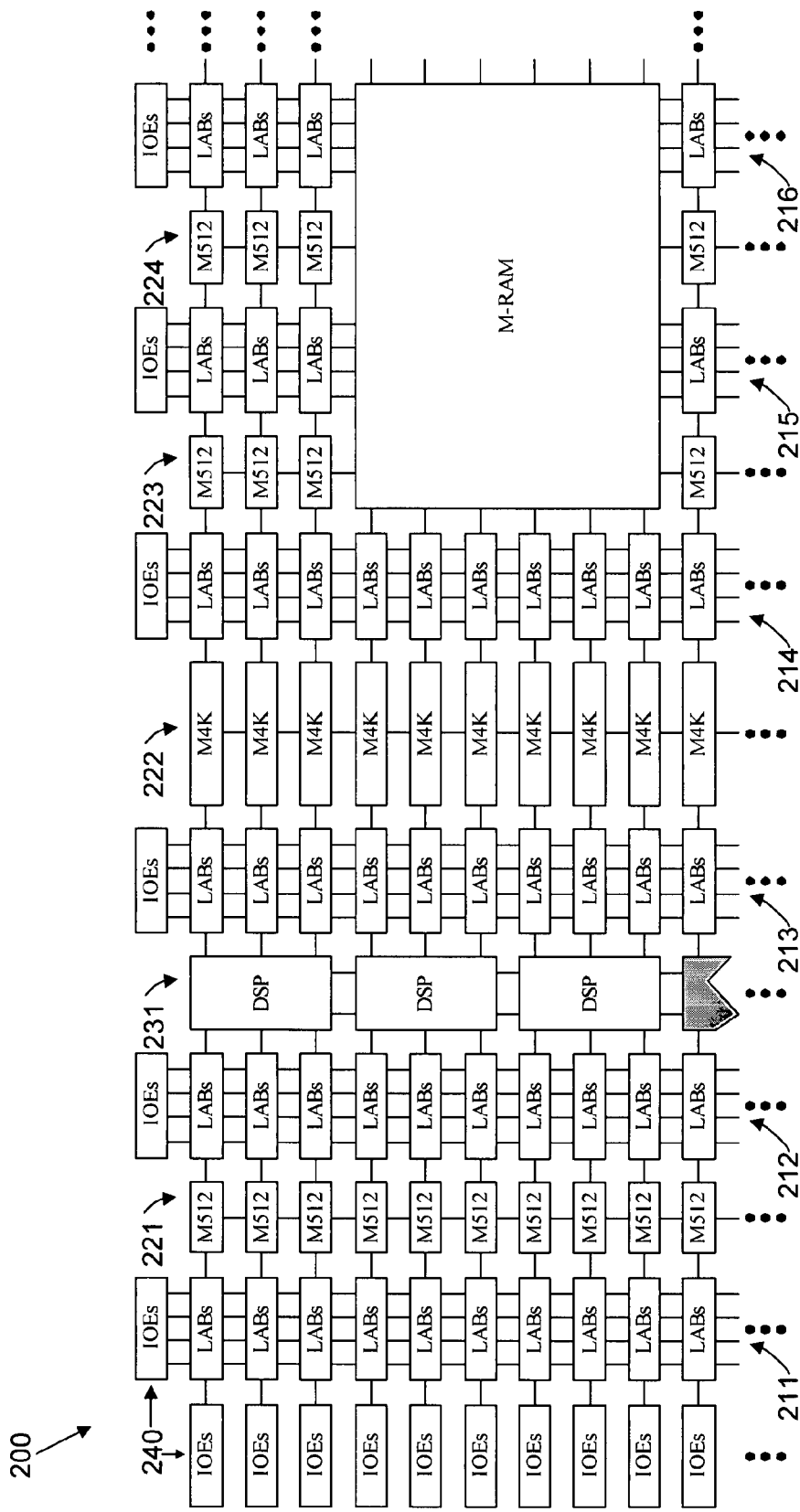
FIG. 2 illustrates an exemplary target device according to an exemplary embodiment of the present invention.

FIG. 2 illustrates an exemplary target device 200 in which a system may be implemented on 200 utilizing an FPGA according to an embodiment of the present invention. According to one embodiment, the target device 200 is a chip having a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. LUT chain connections transfer the output of one logic block LUT to the adjacent logic block for fast sequential LUT connections within the same LAB. Register chain connection lines transfer the output of one logic block register to the adjacent logic block's register within a LAB. According to an alternate embodiment of the present invention, the logic block may operate similarly to an adaptive logic module (ALM), such as those found in Stratix™ manufactured by Altera® Corporation. In this embodiment, the logic block may include 2 registers, 2 sets of addition circuitry, a combinational logic module that may be configured to implement two single six input LUT, or two LUTs with five or fewer inputs. LABs are grouped into rows and columns across the target device 200. Columns of LABs are shown as 211-216. It should be appreciated that the logic block may include additional or alternate components.

According to an embodiment of the present invention, additional registers are available for implementing logic functions with the logic blocks in the target device. The additional registers may be associated with a LAB or a subset of logic blocks within a LAB. The registers may be independent registers that are not associated with a specific logic block. Alternatively, the registers may be integrated inside logic blocks.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The target device 200 also includes a plurality of row interconnect lines ("H-type wires") (not shown) that span fixed distances. Dedicated row interconnect lines, route signals to and from LABs, DSP blocks, and memory blocks within the same row. The row interconnect lines may span a distance of up to four, eight, and twenty-four LABs respectively, and are used for fast row connections in a four-LAB, eight-LAB, and twenty-four-LAB region. The row interconnects may drive and be driven by LABs, DSP blocks, RAM blocks, and horizontal IOEs.

The target device 200 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. The column interconnect lines may traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, Stratix™, Cyclone™, Stratix™ II, and Cyclone™ II families of chips and those employed by Xilinx® Inc. in its Virtex™ and Virtex™ II, and Virtex IV™ line of chips.

Figure 3:
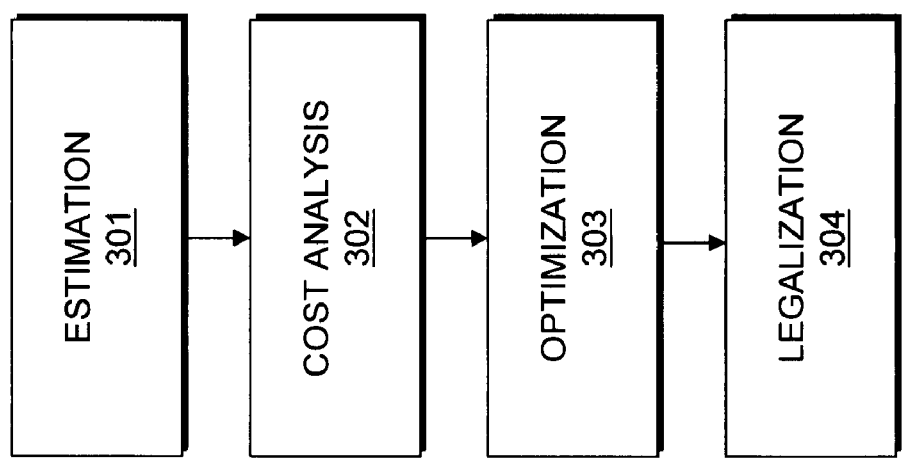
FIG. 3 is a flow chart illustrating a method for performing physical synthesis according to an exemplary embodiment of the present invention.

FIG. 3 is a flow chart illustrating a method for performing physical synthesis according to an exemplary embodiment of the present invention. The method for performing physical synthesis as shown in FIG. 3 may be implemented at 102, 105, 107, and/or 109 as shown in FIG. 1. At 301, estimation is performed to predict and estimate characteristics of a circuit. The characteristics may include delay, area, power, and/or wirelength. When accurate characterization is available, the estimator may read information from a pre-existing model, stage, or structure.

To generate an estimation of delay, a delay modeling and timing analysis is performed. Delay modeling estimates the delays for specific connections in a netlist. The delay model may be as accurate as an exact routing delay estimation, if routes are available, or may require an extensive prediction from an existing netlist structure. After the delays are estimated, a static timing analysis is performed on the netlist. Static timing analysis may analyze each path in the circuit and verify if the path is able to meet all of its timing constraints. Static timing analysis generates a slack of the path which describes how far a path is from meeting its constraint. Slack may be described with the following relationship.

SLACK (path)=TIMING CONSTRAINT (path)−DELAY (path)

To generate an estimation of an area required to implement the circuit, an area count is performed after technology mapping. The area count counts the number of combinational nodes required to implement the circuit. Prior to technology mapping, the area estimator performs area modeling to help predict the final area of the circuit. The area modeling may utilize a constant area model, entropy, average cube complexity, or other techniques to estimate the area of the circuit. It should be appreciated that other techniques may also be used to generate an estimation of delay, area, power, and routability.

To generate an estimation of power consumed by the circuit, vectorless estimation techniques or test vectors input at the design entry stage of the design flow may be used. Estimation of the amount of power consumed by the circuit may include the amount of power consumed by the design as a whole as well as by individual wires. Transition densities for connections and paths may also be computed in the estimation of power.

To generate an estimation of routability, the same delay modeling used in delay estimation may be used to estimate the length of a specific path or connection. By running a router, the routing congestion of a design can also be estimated.

At 302, cost analysis is performed. According to an embodiment of the present invention, a cost function is used for the cost analysis that is a mapping function G( ) for each path in the circuit that takes the circuit characteristics predicted by the estimations performed at 301 and transforms these estimated values into a normalized criticality value that ranges from [0,1], according to constraints and priorities specified by the designer.

$$G \text{ (slack, area, power, routability)} \rightarrow [0,1]$$

Connections that are important are given a criticality value near 1, while connections are non-important are given a criticality value near 0. For example, when solely considering a timing constraint optimization goal, connections that have the lowest slack values (those furthest from meeting their constraints) are given a criticality value of 1, where those with the highest slack values are given a criticality value of 0.

In addition to a cost per-path in the circuit, the cost function may also calculate a global cost of the entire circuit (figure of merit). The global cost of a circuit may be used to compare different versions of a circuit to determine which provides a better result.

At 303, optimization is performed on the netlist. The goal of the optimization may include reducing delay, reducing area, reducing power consumption, improving routability, and/or other goals. According to an embodiment of the present invention, the criticality values noted by the cost function indicate which paths in the netlist are to be optimized. Reducing delay, reducing power consumption, and improving routability share a similar goal in optimization of reducing the length of critical paths. A critical path is a path that is far from meeting timing constraints, has a high toggle rate, or contents for congested routes. Techniques used for reducing the length of a critical path include incremental retiming, combinational or binary decision diagram (BDD)-based resynthesis, logic replication, and local rewiring. For reducing the area required for a circuit, the area of non-critical connections (connections have 0 or near 0 criticality values) may be reduced. Techniques used for reducing the area of the non-critical connections may include combinational resynthesis to find more area optimal representations for a cone of combinational logic. Alternatively, the combinational and sequential logic may be mapped into unused resources such as memories. It should be appreciated that other techniques may also be used to optimize the design of the system.

Figure 4A:
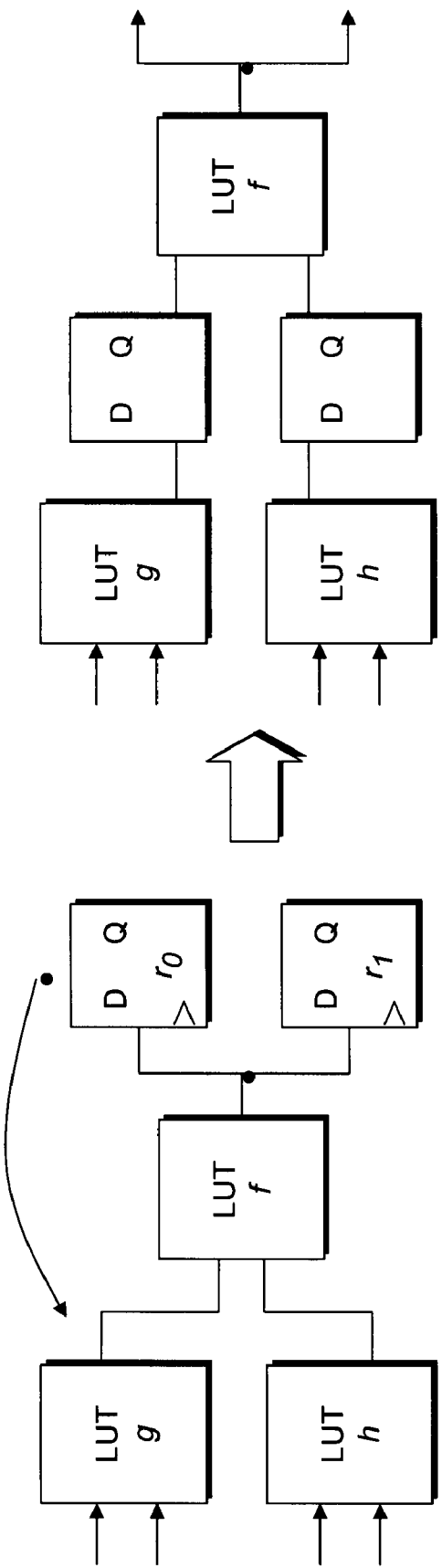
FIGS. 4a and 4b illustrate examples of backward and forward retiming pushes according to an exemplary embodiment of the present invention.
Figure 4B:
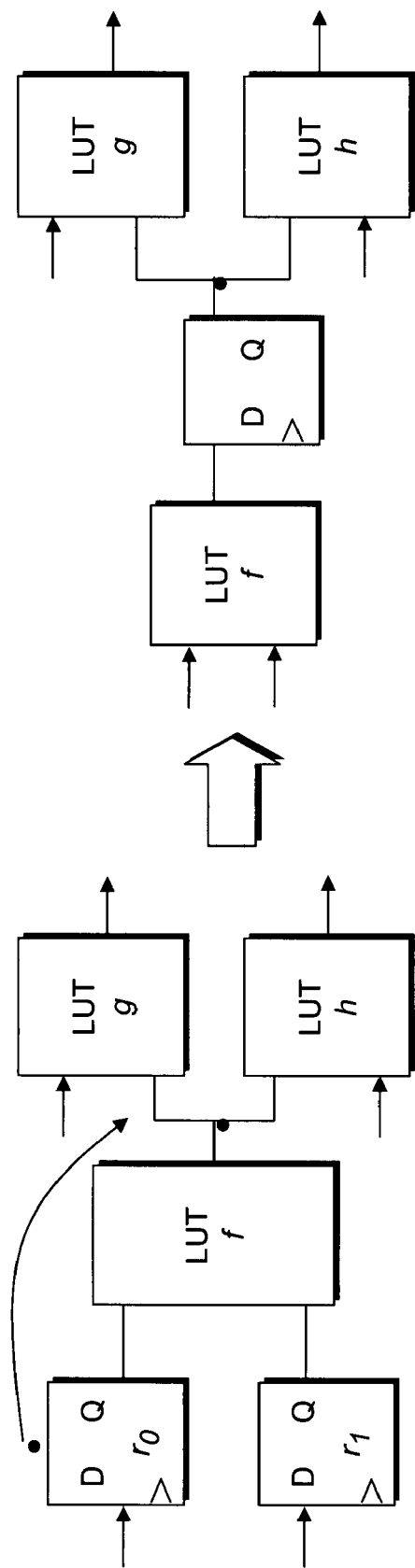

According to an embodiment of the present invention, incremental retiming involves performing a series of backward and forward retiming iterations. During a backward retiming iteration, registers with inputs that come from a critical or near critical path are identified. These registers are pushed backwards across the logic driving it as illustrated in FIG. 4a. During a forward retiming iteration, registers with outputs that are connected to a critical or near critical path are identified. These registers are pushed forward across the logic being driven as illustrated in FIG. 4b. During both backward and forward pushes, the functionality of the circuit remains unchanged during power-up and reset conditions. According to an embodiment of the present invention, registers are set to zero on power-up. Reset signals also set the registers to zero. The functionalities of LUTs f, g, and h are changed to preserve the power-up and reset functionality expected of the sub-circuits illustrated.

According to an embodiment of the present invention, BDD-based resynthesis involves using a procedure to find alternative functional decompositions for critical or near critical logic in a circuit. Given a function f(X,Y) defined over two sets of variables X and Y, functional decompositions finds subfunctions g1(Y), g2(Y), ..., gk(Y) such that f can be re-expressed in terms of f(X, g1(Y), g2(Y), ..., gk(Y)). The set of variables X is referred to as the free set and the set of variables Y is referred to as the bound set. If there are no variables common to X and Y, the decomposition is said to be disjoint. Otherwise, the decomposition is said to be non-joint.

Figure 5:
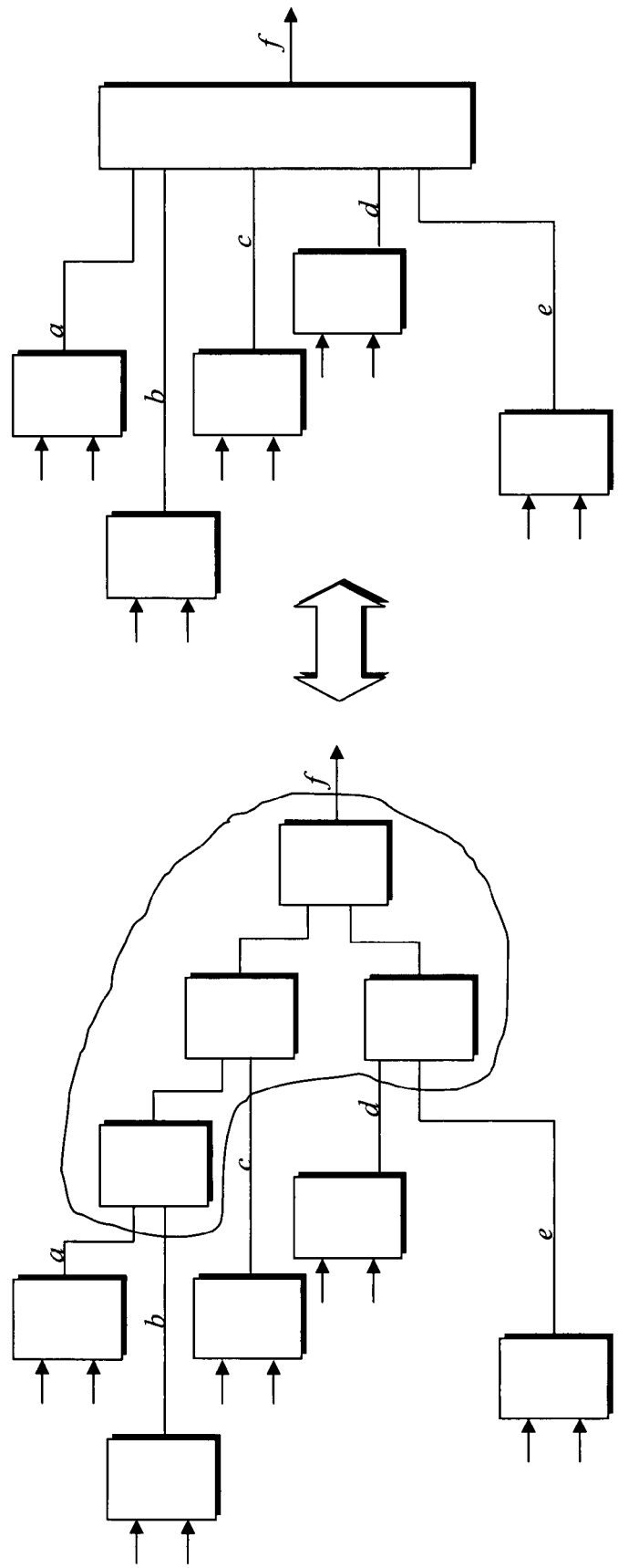
FIG. 5 illustrates an example of a BDD-based resynthesis operation according to an exemplary embodiment of the present invention.
Figure 6:
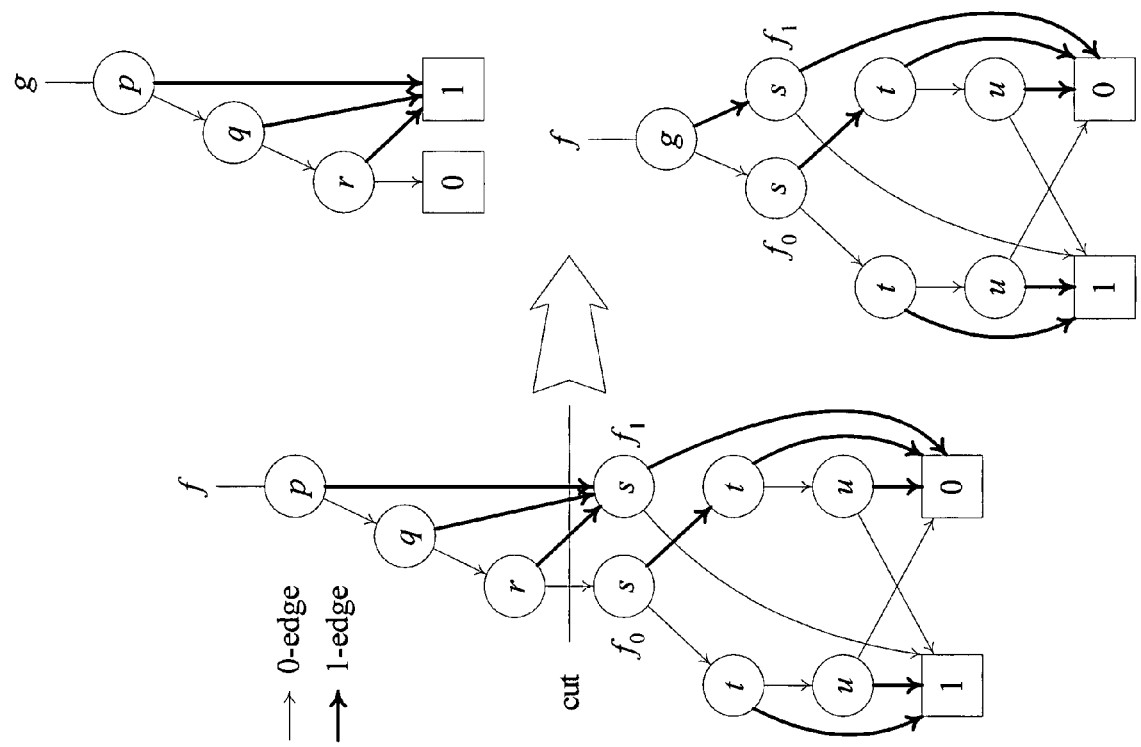
FIG. 6 illustrates an example of BDD-based decomposition according to an exemplary embodiment of the present invention.

The LUTs in an FPGA are capable of implementing any function of k variables. Functional decomposition can be used to find sub-functions that fit naturally into LUTs. FIG. 5 illustrates an example of resynthesis. First, a LUT with critical inputs is identified. Next, a cone of logic rooted at f is grown. The cone is then collapsed into a single LUT and a BDD representing the functionality of the cone constructed. Functional decomposition is performed directly on the BDD. At each step of the decomposition, a single LUT suitable for the target architecture is extracted from the BDD and BDD is re-expressed in terms of the extracted LUT. This procedure is continued until the remaining BDD fits into a single LUT. FIG. 6 illustrates an example of BDD-based functional decomposition. FIG. 6 illustrates a reduced, ordered BDD for the function $f=(p+q+r)\bar{s}+\overline{(p+q+r)}(\bar{s}t+\bar{s}u+\bar{s}\bar{t}\bar{u})$. An alphabetical ordering of the variables for the BDD of f is used. During resynthesis, a sifting procedure moves non-critical variables to the top of the BDD. A cut in the BDD establishes two sets of variables. The variables above the cut constitute a bound set and the variables below the cut constitute a free set. FIG. 6 illustrates a cut in f that separates the bound set, {p, q, r}, from the free set {s, t, u}. The portion of the BDD above the cut references two distinct functions, $f_0$ and $f_1$, below the cut. Thus, the portion of the BDD above the cut can be replaced by a single Boolean variable g that determines whether $f_0$ or $f_1$ is to be selected. A separate BDD computes the value for g, and in the new BDD for $f$, $f_0$ is selected when g=0 and $f_1$ is selected when g=1. The resulting decomposition can be expressed as g=p+q+r and $f=g\bar{s}+\bar{g}(\bar{s}t+\bar{s}u+\bar{s}\bar{t}\bar{u})$.

Figure 7:
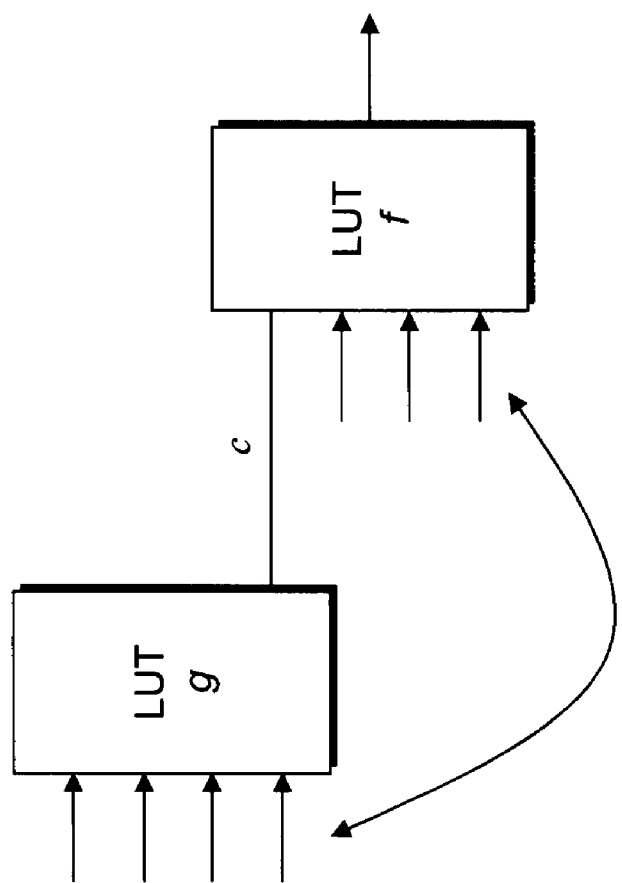
FIG. 7 illustrates an example of local rewiring according to an exemplary embodiment of the present invention.

FIG. 7 illustrates an example of local rewiring optimization according to an embodiment of the present invention. In this example, a pair of LUTs, f and g, are identified that are connected by a critical signal c. Using functional decomposition techniques, it is determined whether the overall timing of the two LUTs can be improved by swapping some of the non-critical signals attached to f with some of the critical signals attached to g. Although local rewiring and BDD-based resynthesis use functional decomposition techniques, they operate on two different scales. Local rewiring considers two LUTs at a time while BDD-based resynthesis considers entire cones at a time. The result is that the operations carried out during local retiming have much more predictable timing changes and introduce very little illegality into an existing circuit.

Figure 8:
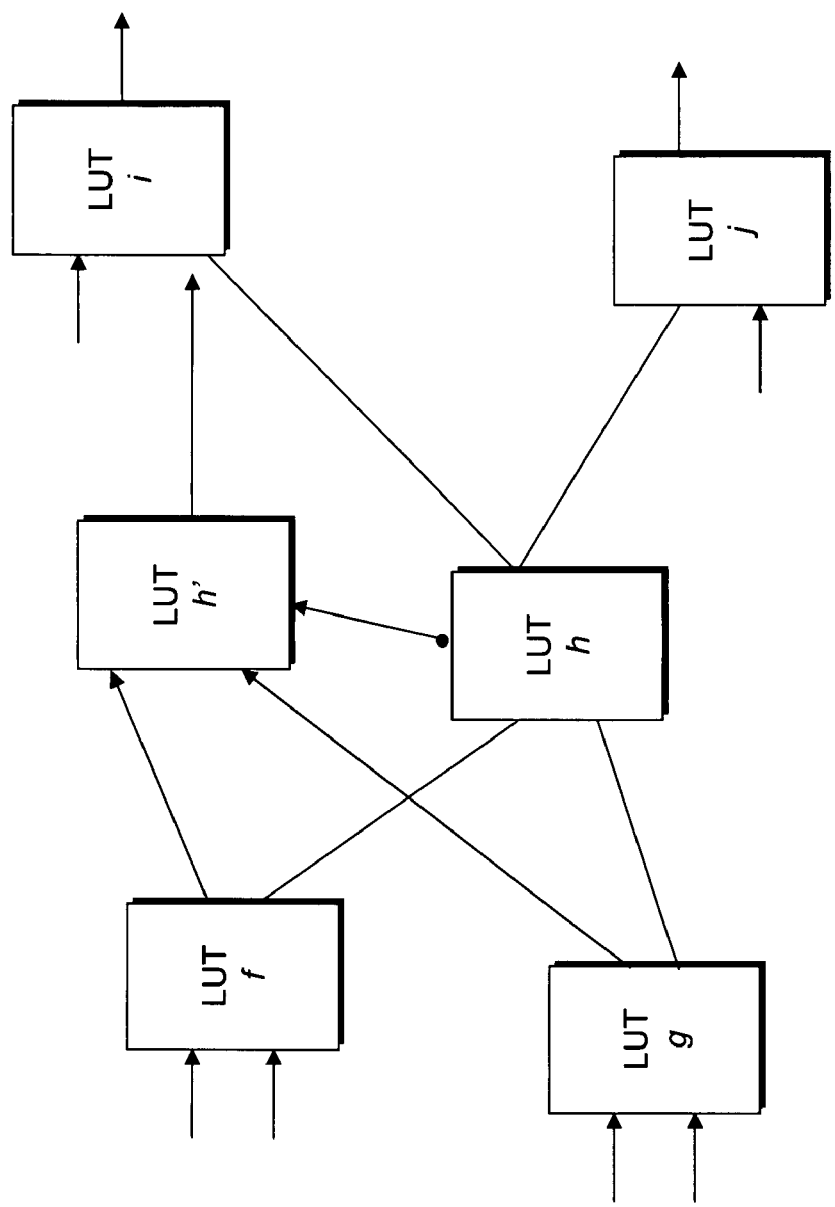
FIG. 8 illustrates an example of logic replication according to an exemplary embodiment of the present invention.

According to an embodiment of the present invention, logic replication is utilized to generate a duplicate of a component. The duplicate is used to reduce the length of a critical path associated with the component without significantly affecting the length of other paths in the system. Logic replication includes making an identical copy of a component, which may include a combination of a LUT and a register, on a critical or near-critical path. The duplicate is placed in a determined location that improves the overall slack of the system. FIG. 8 illustrates an example of logic replication according to an exemplary embodiment of the present invention. Following a placement procedure in the design flow, a LUT that drives a signal with several fanouts may be placed at a location that is not ideally suited for any of its fanouts. In FIG. 8, LUT h drives tow LUTs, i and j, and LUT h has been placed at a location that balances its need to drive both LUTs at the same time. However, if connection c is critical, LUT h can be replicated to produce a new LUT h' which can be placed closer to the target of c. Logic replication may perform this transformation on critical signals driven by multi-fanout sources.

Referring back to FIG. 3, at 304 legalization is performed on the system. Physical synthesis optimizations performed at 303 may transform a circuit such that placement or routing becomes invalid. Various procedures may be used to legalize the system depending on the optimization performed at 303. After performing optimizations in a post-technology mapping physical synthesis stage, it may be necessary to legalize the LUTs. This may be achieved by utilizing rotation, decomposition, and inversion to re-implement each LUT into legal LUTs. After performing optimizations in a post-placement stage, it may be necessary to legalize wires that have been created and place new LUTs created. This may be achieved by performing incremental placement to integrate the modifications made by timing driven optimizations into existing placement while perturbing the existing placement as little as possible. After performing optimization in a post-routing stage, it may be necessary to legalize the routing changes made. This may be achieved by performing incremental re-routing to determine valid routes for the modified circuit. It should be appreciated that other techniques may also be used to perform legalization on the system.

Timing driven optimizations that take place during fine physical synthesis 107 (shown in FIG. 1) may create an invalid placement. For example, a BDD-based resynthesis procedure may create new wires that violate the constraint on the number of wires entering a LAB. A logic replication algorithm may create new LEs which would require placement. Incremental placement may be used to integrate the modifications made by the timing driven optimizations into the existing placement. The primary goal of incremental placement is to resolve architectural violations crated when the circuit modifications are integrated into existing placement. Nearly all architectural constraints in modern FPGAs are found in the clustered logic blocks, such as LABs. Some common constraints include a limit on the number of LEs in a cluster, the number of inputs to a cluster, the number control signals that can be used within a cluster. Incremental placement uses an iterative improvement strategy where logic elements are moved according to a cost function. This cost function includes three components cluster legality cost, timing cost, and wirelength cost. Cluster legality costs relate to the penalty imposed on a cluster if it includes any architectural violations. The cost may be proportional to the total number of constraints violated. Timing costs may be used to ensure that critical logic elements are not moved into locations that would significantly increase the critical path delay. Wirelength cost may be used to endure that a circuit is easily routable after the logic element moves. The total cost is a weighted sum of these costs. Cost lowering moves may be made in incremental placement until no further illegalities exist in placement.

Figure 9:
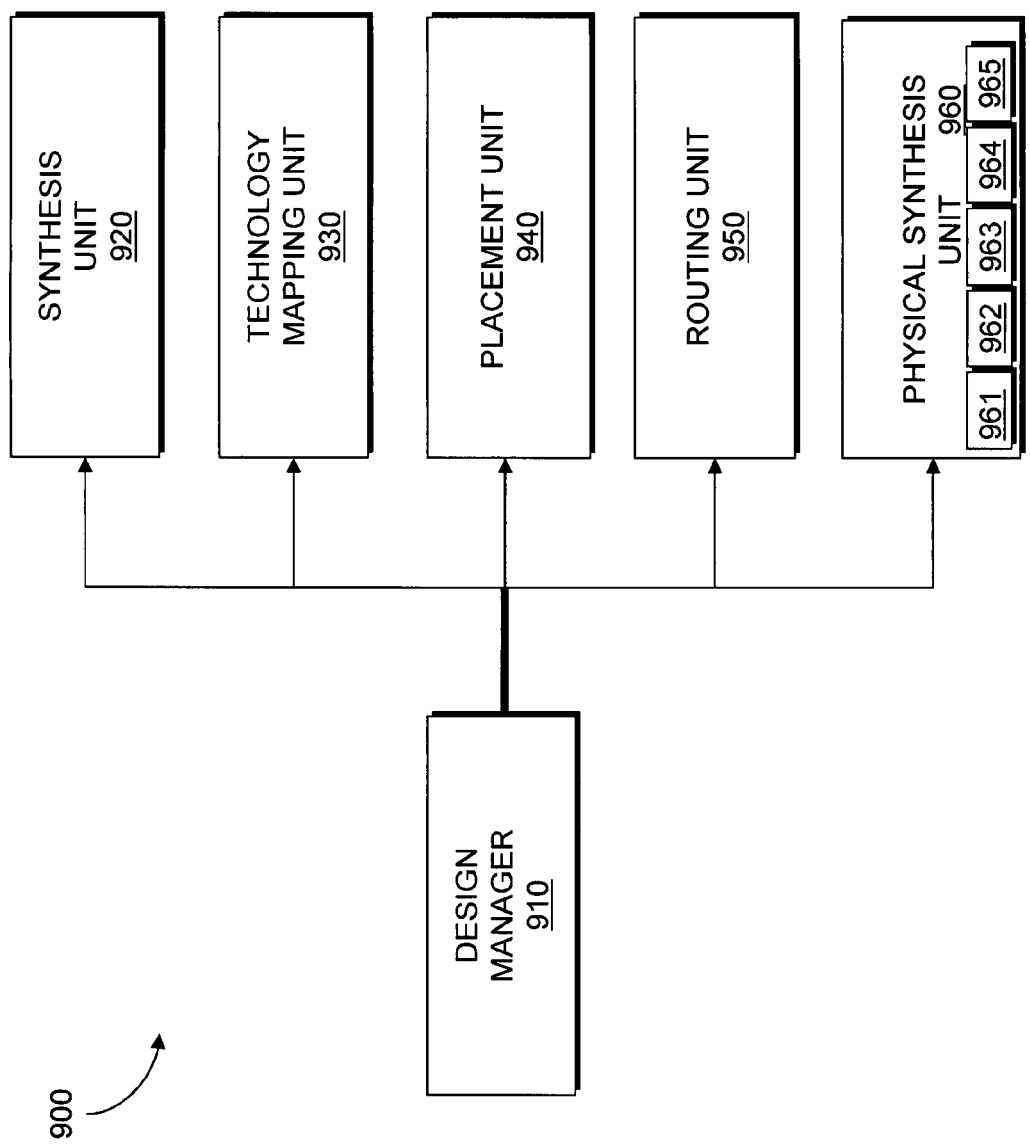
FIG. 9 illustrates a system designer according to an exemplary embodiment of the present invention.

FIG. 9 illustrates a system designer 900 according to an embodiment of the present invention. The system designer 900 may be an EDA tool for designing a system on a target device. The target device may be, for example, an ASIC, a structured ASIC, an FPGA, a PLD, or other circuitry. Furthermore the logic design may be implemented using semiconductor or nanoelectronic technology. FIG. 9 illustrates software modules implementing an embodiment of the present invention. According to one embodiment, system design may be performed by a computer system executing sequences of instructions represented by the software modules shown in FIG. 9. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 900 includes a designer manager 910. The designer manager 910 receives a design for a system. The design may be described at a gate level or in a more abstract level. The design may be described in terms of an HDL such as VHDL or Verilog. The target device may be an ASIC, structured ASIC, FPGA, PLD, or other target device. The designer manager 910 is connected to and transmits data between the components of the system designer 900.

Block 920 represents a synthesis unit that performs synthesis. The synthesis unit 920 generates a logic design of a system to be implemented in the target device. According to an embodiment of the system designer 900, the synthesis unit 920 takes a conceptual HDL design definition and generates an optimized logical representation of the system. The optimized logical representation of the system generated by the synthesis unit 920 may include a representation that has a minimized number of functional blocks and registers, such as logic gates and logic elements, required for the system. Alternatively, the optimized logical representation of the system generated by the synthesis unit 920 may include a representation that has a reduced depth of logic and that generates a lower signal propagation delay.

Block 930 represents a technology mapping unit that performs technology mapping. The technology mapping unit 930 determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 940 represents a placement unit that performs placement. The placement unit 940 places the system on to the target device by determining which components or areas on the target device are to be used for specific functional blocks and registers. According to an embodiment of the system designer 900, the placement unit 940 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 940 may utilize a cost function in order to determine a good assignment of resources on the target device.

Block 950 represents a routing unit that performs routing. The routing unit 950 determines the routing resources on the target device to use to provide interconnection between the components implementing functional blocks and registers of the logic design.

Block 960 represents a physical synthesis unit that performs physical synthesis. The physical synthesis unit 960 may perform physical synthesis immediately after design entry and prior to synthesis, immediately after technology mapping and prior to placement, immediately after placement and prior to routing, immediately after routing, and/or during other times. According to an embodiment of the present invention, physical synthesis includes a series of circuit transformations to optimize the circuit for a given goal. The circuit transformations occur outside the stage of design entry, synthesis, technology mapping, placement, and routing. Physical synthesis may be used to optimize a circuit for goals such as reducing a delay of a signal transmitted on a circuit, reduction of an area required for implementing the circuit on a target device, reducing the amount of power required for operating the circuit or the system, improving the routability of the circuit, and/or other goals as described with reference to FIG. 1.

The physical synthesis unit 960 includes an estimation unit 961. The estimation unit 961 predicts and estimates characteristics of a circuit. The characteristics may include delay, area, power, and/or wirelength. The estimation unit 961 may perform the procedures described with reference to 301 in FIG. 3.

The physical synthesis unit 960 includes a cost analysis unit 962. The cost analysis unit 962 uses a cost function that maps a function G( ) for each path in the circuit that takes the circuit characteristics predicted by the estimation unit 961 and transforms these estimated values into a normalized criticality value that ranges from [0,1], according to constraints and priorities specified by the designer. The cost analysis unit 962 may perform the procedures described with reference to 302 in FIG. 3.

The physical synthesis unit 960 includes an optimization unit 963. The optimization unit 963 may utilize circuit transformation techniques such as incremental retiming, combinational or binary decision diagram (BDD)-based resynthesis, logic replication, and local rewiring to achieve the goal of reducing the area required for a circuit, reduce the delay of a signal, reduce the power required for a system, improve routability, and/or other goals. The optimization unit 963 may perform the procedures described with reference to 303 in FIG. 3.

The physical synthesis unit 960 includes a legalization unit 964. The legalization unit 964 may perform one or more procedures to legalize the system if the optimization unit 963 has created invalidated placement or routing of the system. The procedures performed by the legalization unit 964 include rotation, decomposition, and inversion to re-implement components on the target device, incremental placement to integrate the modifications made by timing driven optimizations into existing placement while perturbing the existing placement as little as possible, incremental re-routing to determine valid routes for the modified circuit, and/or other techniques. The legalization unit 964 may perform the procedures described with reference to 304 in FIG. 4.

The physical synthesis unit 960 includes a hill-climbing management unit 965. The hill-climbing management unit 965 utilizes branch prediction in order to perform parallel hill-climbing when performing physical synthesis and other procedures in the system design flow. The features of the hill-climbing management unit 965 will be further discussed with reference to FIGS. 13, 14*a*-14*c*, and 15.

It should be appreciated that each of the sub-units in the physical synthesis unit may save the results it generates and that each of the sub-units in the physical synthesis unit may output the results it generates onto a display device or other appropriate medium.

According to an embodiment of the system designer 900, the design manager 910 performs an assembly procedure that creates a data file that includes the design of the system generated by the system designer 900. The data file may be a bit stream that may be used to program the target device. The design manager 910 may output the data file so that the data file may be stored or alternatively transmitted to a separate machine used to program the target device. It should be appreciated that the design manager 910 may also output the design of the system in other forms such as on a display device or other medium.

Figure 10:
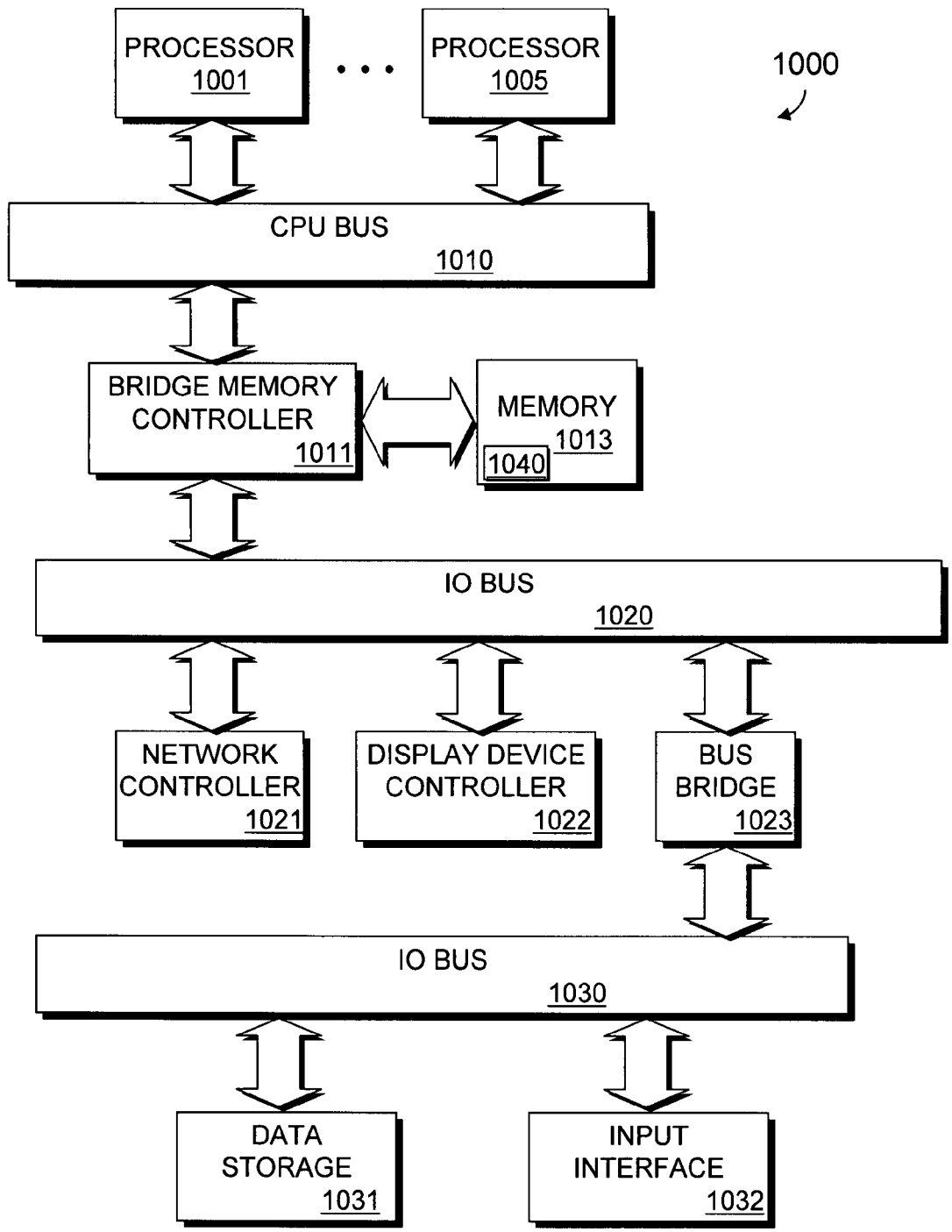
FIG. 10 illustrates a computer system according to an exemplary embodiment of the present invention.

FIG. 10 is a block diagram of an exemplary computer system 1000 in which an example embodiment of the present invention resides. The computer system 1000 may be used to implement the system designer 900 shown in FIG. 9. The computer system 1000 includes one or more processors that process data signals. As shown, the computer system 1000 includes a first processor 1001 and an nth processor 1005, where n may be any number. The processors 1001 and 1005 may be a complex instruction set computer microprocessor, a reduced instruction set computing microprocessor, a very long instruction word microprocessor, a processor implementing a combination of instruction sets, or other processor device. The processors 1001 and 1005 may be multi-core processors with multiple processor cores on each chip. Each of the processors 1001 and 1005 and each of the processor cores may support one or more hardware threads. The processors 1001 and 1005 are coupled to a CPU bus 1010 that transmits data signals between processors 1001 and 1005 and other components in the computer system 1000.

The computer system 1000 includes a memory 1013. The memory 1013 may be a dynamic random access memory device, a static random access memory device, and/or other memory device. The memory 1013 may store instructions and code represented by data signals that may be executed by the processor 1001. A cache memory (not shown) may reside inside processor 1001 that stores data signals stored in memory 1013. The cache speeds access to memory by the processor 1001 by taking advantage of its locality of access. In an alternate embodiment of the computer system 1000, the cache resides external to the processor 1001. A bridge memory controller 1011 is coupled to the CPU bus 1010 and the memory 1013. The bridge memory controller 1011 directs data signals between the processor 1001, the memory 1013, and other components in the computer system 1000 and bridges the data signals between the CPU bus 1010, the memory 1013, and a first IO bus 1020.

The first IO bus 1020 may be a single bus or a combination of multiple buses. The first IO bus 1020 provides communication links between components in the computer system 1000. A network controller 1021 is coupled to the first IO bus 1020. The network controller 1021 may link the computer system 1000 to a network of computers (not shown) and supports communication among the machines. A display device controller 1022 is coupled to the first IO bus 1020. The display device controller 1022 allows coupling of a display device (not shown) to the computer system 1000 and acts as an interface between the display device and the computer system 1000.

A second IO bus 1030 may be a single bus or a combination of multiple buses. The second IO bus 1030 provides communication links between components in the computer system 1000. A data storage device 1031 is coupled to the second IO bus 1030. The data storage device 1031 may be a hard disk drive, a floppy disk drive, a CD-ROM device, a flash memory device or other mass storage device. An input interface 1032 is coupled to the second IO bus 1030. The input interface 1032 may be, for example, a keyboard and/or mouse controller or other input interface. The input interface 1032 may be a dedicated device or can reside in another device such as a bus controller or other controller. The input interface 1032 allows coupling of an input device to the computer system 1000 and transmits data signals from an input device to the computer system 1000. A bus bridge 1023 couples the first IO bus 1020 to the second IO bus 1030. The bus bridge 1023 operates to buffer and bridge data signals between the first IO bus 1020 and the second IO bus 1030. It should be appreciated that computer systems having a different architecture may also be used to implement the computer system 1000.

A system designer 1040 may reside in memory 1013 and be executed by one or more of the processors 1001 and 1005. The system designer 1040 may operate to synthesize a system, place the system on a target device, route the system, and perform physical synthesis for the system, where different optimization strategies are performed in parallel on a single netlist utilizing the plurality of threads supported by the processor 1001 and 1005.

According to an embodiment of the present invention, the physical synthesis procedures described with reference to FIG. 1 may be organized as a series of procedures that perform a number of incremental transformation operations on an input system (circuit) netlist. These incremental transformation operations may optimize the circuit for a cost function which may include performance (optimizing paths to reduce delay to meet user timing constraints), area (number of logic elements used), power, and routability. Although each procedure in physical synthesis may target a specific aspect of a circuit such as combinational paths, positioning of registers, or other properties, the procedures often share a common infrastructure.

Exemplary pseudo code that provides an overview of a physical synthesis hill-climbing method according to an exemplary embodiment of the present invention is listed below.

```
1   Sbest ← – ∞
2   Sinitial ← EVALUATENETLIST( )
3   hillClimbing ← 0
4   for i ∈ {0 ... maxPasses)
5       for j ∈ {0 ... maxIters)
6           RUNALGORITMITERATION( )
7           S ← EVALUATENETLIST( )
8           if S > Sbest
9               Sbest = S
10              SAVENETLIST( )
11              hillClimbing ← 0
12          else
13              hillClimbing ← hillClimbing +1
14              if hillClimbing > maxHillClimbing
15                  RESTOREBESTNETLIST( )
16                  break j
17              end if
18          end if
19      end for
```

```
-continued 20       if S < Sbest
21           RESTOREBESTNETLIST
22       end if
23       if S < Sinitial
24           break i
25       end if
26   end for
```

Netlist transformations are performed incrementally in iterations. In order to allow for hill-climbing, these iterations are organized in two nested cycles. At the end of each iteration, the netlist is evaluated according to some figure of merit and compared to the best netlist known thus far. Depending on the result of this comparison, the iteration is declared either better or worse. The outer cycle is executed up to a maximum number of passes or until no more gain is obtained. The inner loop is where the actual hill-climbing is performed. Even when the netlist is evaluated to be worse than the best result found thus far, the search is continued. Unless a better netlist is eventually found, this hill-climbing search is continued until a maximum number of unsuccessful iterations are performed. At the end of the hill-climbing search, the best netlist is restored. Hill-climbing is aimed at exploring the solution space in an attempt to escape local minima. This approach has proven to be highly beneficial in improving the quality of the optimization result.

Figure 11:
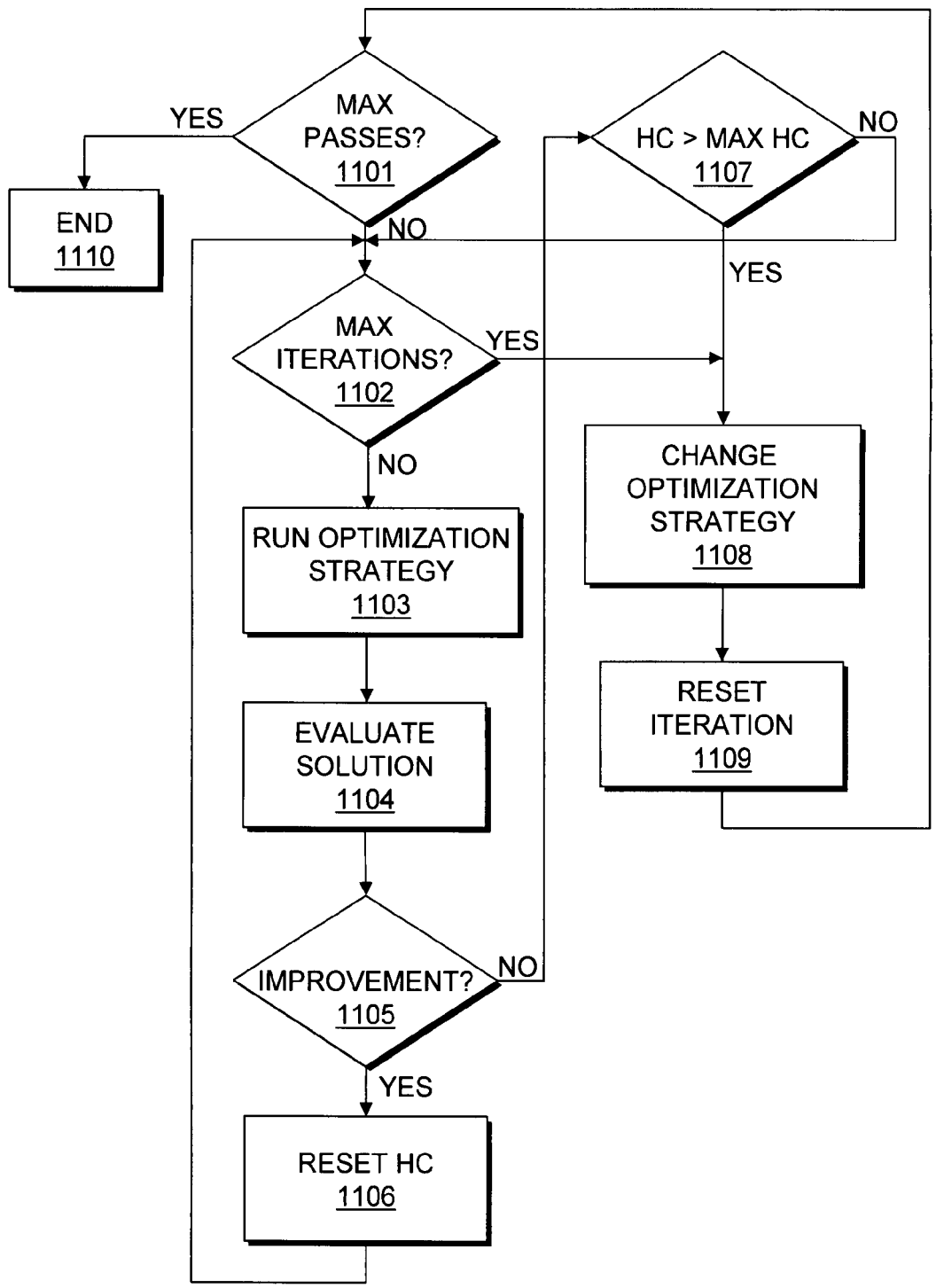
FIG. 11 is a flow chart illustrating a method for performing hill climbing according to an exemplary embodiment of the present invention.

FIG. 11 is a flow chart illustrating a method for performing sequential hill-climbing according to an exemplary embodiment of the present invention. The embodiment illustrated in FIG. 11 includes some of the procedures illustrated in the pseudo code listed above. At 1101, it is determined whether a current pass (i) has reached the maximum number of passes (maxPasses) allowed. According to an embodiment of the present invention, a physical synthesis procedure is set to run up to a maximum number of passes where each pass may be designated by the physical synthesis procedure to perform optimization using a particular strategy. According to an embodiment of the present invention, a strategy may include a specific technique such as incremental retiming, combinational or BDD-based resynthesis, logic replication, local rewiring, or other techniques. A strategy may also include a particular direction taken by one of the techniques listed above or other techniques. If the maximum number of passes has been reached, control proceeds to 1110. If the maximum number of passes has not been reached, control proceeds to 1102.

At 1102, it is determined whether a current iteration (j) has reached a maximum number of iterations (maxIters) allowed. According to an embodiment of the present invention, each pass in a physical synthesis procedure is set to run up to a maximum number of iterations. According to an embodiment of the present invention, an iteration may be defined by a number of transformations executed, a period of time of execution, or by other terms. If a pass has reached its maximum number of iterations, control proceeds to 1108. If a pass has not reached its maximum number of iterations, control proceeds to 1103.

At 1103, the optimization strategy is run on an existing netlist for an iteration. The optimization strategy generates a solution in the form of a new netlist.

At 1104, the solution generated from running the optimization strategy is evaluated after the iteration. According to an embodiment of the present invention, the solution is run through a cost function that generates a cost value. The cost function may take into account a parameter that the optimization strategy is targeting. It should be appreciated that the cost function may take into account other criteria as well. It should be appreciated that instead of using a cost function and generating a cost value that other figures of merit may be generated using other appropriate techniques and criteria.

At 1105, it is determined whether the solution generated from running the optimization strategy is an improvement. According to an embodiment of the present invention, the cost value generated for the solution is compared with a cost value generated from a solution prior to running the optimization strategy. If the solution generated from running the optimization strategy is an improvement, control proceeds to 1106. If the solution generated from running the optimization strategy is not an improvement, control increments a counter that tracks a number of hill-climbing iterations have been taken (hillclimbing) and proceeds to 11107.

At 11106, a counter that tracks a number of hill-climbing (HC) iterations have been taken is reset to zero.

At 1107, it is determined whether the number of hill-climbing iterations that have been taken exceeds a maximum number of hill-climbing iterations permissible (maxHillClimbing). If the number of hill-climbing iterations have not exceeded the maximum number of hill-climbing iterations permissible, control returns to 1102. If the number of hill-climbing iterations have exceeded the maximum number of hill-climbing iterations permissible, control proceeds to 1108.

At 1108, a change is made to the optimization strategy. The change in optimization strategy is to be applied to the best solution as determined at 1104.

At 1109, the iteration number (j) is reset to 0. Control returns to 1101 where a new next pass is started.

At 1110, control terminates the procedure.

Figure 12:
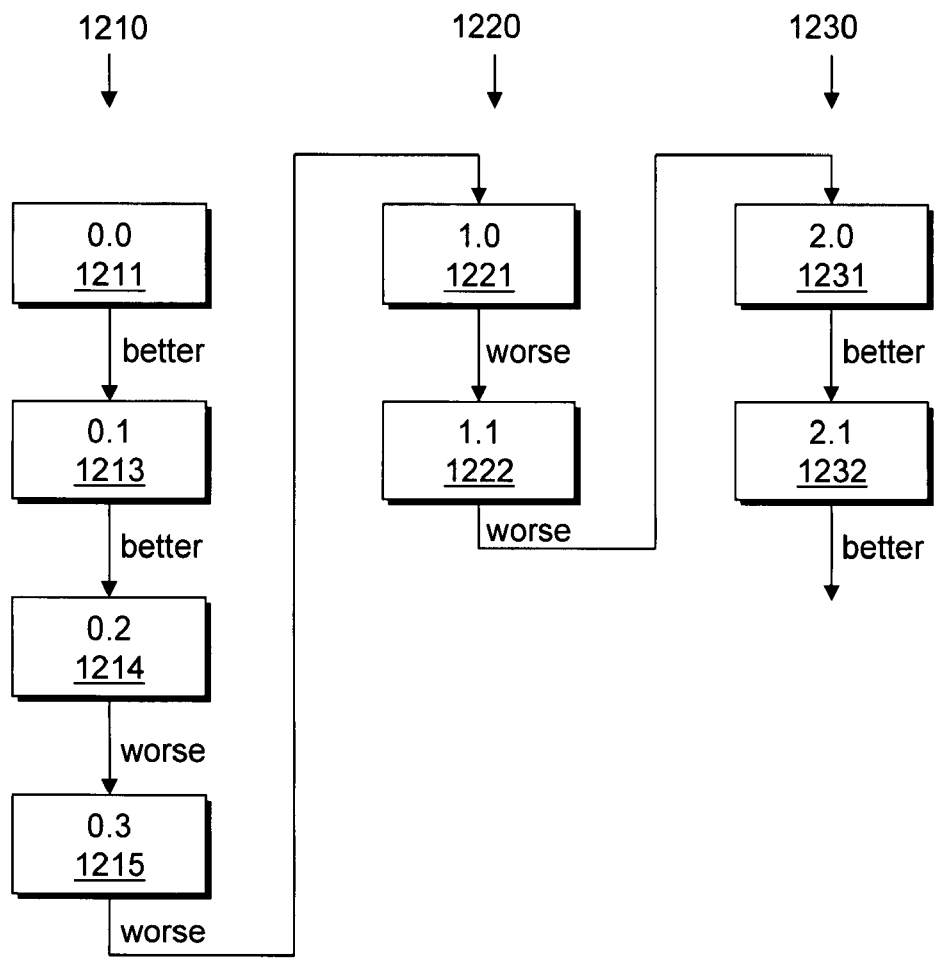
FIG. 12 illustrates an example of sequential hill-climbing according to an exemplary embodiment of the present invention.

FIG. 12 illustrates an example of sequential hill-climbing according to an exemplary embodiment of the present invention. In this example, the ith pass and jth iteration of the physical synthesis procedure is denoted as "i.j". In this example, a zeroth pass of the physical synthesis procedure yields iterations 1211, 1213, 1214, and 1215 as illustrated by column 1210. A first pass of the physical synthesis procedure yields iterations 1221 and 1222 as illustrated by column 1220. A second pass of the physical synthesis procedure yields iterations 1231 and 1232. The physical synthesis procedure allows two hill-climbing iterations (maxHillClimbing=2). In the zeroth pass, iterations 0.0 and 0.1 produce a better netlist. Iteration 0.2 produces a worse netlist. Because of hill-climbing, optimizations are still performed on the "bad netlist" where only the "good" netlists are saved. Iteration 0.3 produces another worse netlist. Since only two hill-climbing iterations are used by the physical synthesis procedure in this example, the zeroth pass 1220 is terminated and different optimization strategy is selected for the next (first pass 1220) using the best netlist seen thus far. The best netlist seen thus far is the netlist saved before iteration 0.2. In the first pass 1220, iterations 1.0 and 1.1 do not provide any gain. Therefore, the same netlist is used for iteration 2.0 in the second pass 1230. In this example, a better net list is found after iterations 2.0 and 2.1. In this example, a total of 8 iterations were run, but only 4 of the iterations yielded solutions that were actually beneficial. A total of 4 iterations yielded unproductive hill-climbing operations.

Exemplary pseudo code that provides an overview of a physical synthesis hill-climbing method with branch prediction according to an exemplary embodiment of the present invention is listed below.

```
1   function HILLCLIMB(P)
2       Sbest ← – ∞
3       Sinitial ← EVALUATENETLIST( )
4       Sorigin ← (P,0)
5       hillClimbing ← 0
6       for i ∈ {P ... maxPasses)
7           for j ∈ {0 ... maxIters)
8               for k ∈ {P+1 ... maxPasses)
9                   if NOT RUNNING(Sorigin, k)
                       AND COST ACCEPTED (i,j,k)
10                      spawn HillClimb(k)
11                  end if
12              end for
13              RUNALGORITHMITERATION( )
14              S ← EVALUATENETLIST( )
15              if S > Sbest
16                  Sbest = S
17                  SAVENETLIST( )
18                  Sorigin ← (i,j)
19                  hillClimbing ← 0
20                  for t ∈ {allOtherThreads)
21                      if ISMYDESCENDANT(t)
22                          kill t
23                      end if
24                  end for
25              else
26                  hillClimbing ← hillClimbing +1
27                  if hillClimbing > maxHillClimbing
28                      RESTOREBESTNETLIST( )
29                      break j
30                  end if
31              end if
32          end for
33          if S < Sbest
34              RESTOREBESTNETLIST( )
35          end if
36          if S < Sinitial
37              break i
38          end if
39      end for
40  end function
```

According to an embodiment of the present invention, branch prediction is used in a parallel implementation of the physical synthesis procedure to reduce compile time. In the exemplary pseudo code illustrated above, each thread is identified by three variables (i,j,P). The values i,j indicate the origin of the thread's netlist, and the value P indicates the starting hill-climbing pass for the thread. Each thread has its own copy of Sorigin, Sbest, Sinitial, hillClimbing, and the netlist saved by SAVENETLIST. Each spawned thread also begins with a copy of its parents' variables. The function COSTACCEPTED(i,j,k) determines whether or not the thread should be spawned. On lines 7 through 1, prior to running the actual transformation operation in each iteration, additional threads are spawned speculatively. Each thread starts on a different pass, assuming all previous passes have failed. On lines 20 through 24, when an iteration proves successful, yielding a "better" solution, all descendant threads (threads spawned by the thread, and any of their descendants, recursively) are terminated.

Figure 13:
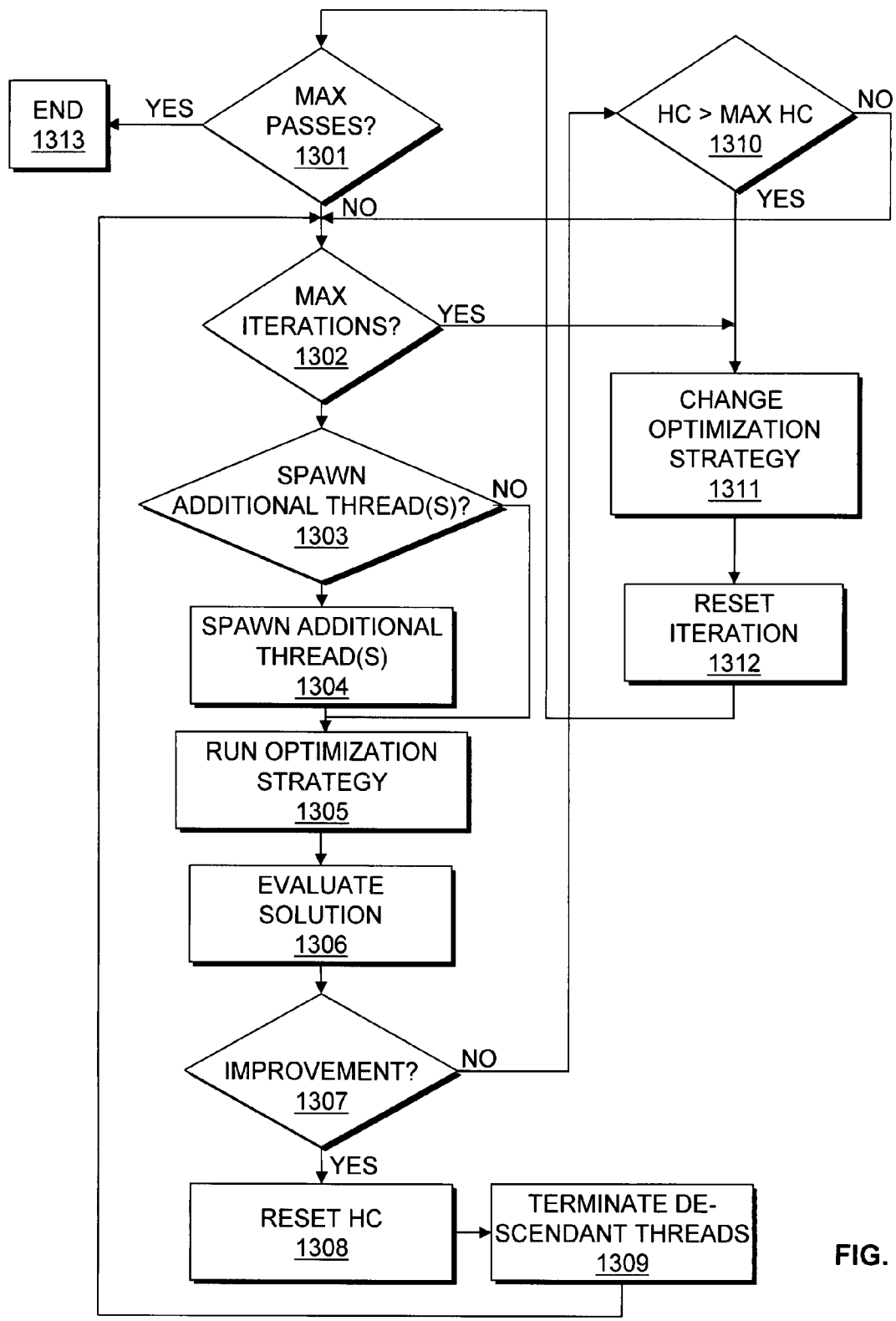
FIG. 13 is a flow chart illustrating a method for performing hill-climbing with branch prediction according to an exemplary embodiment of the present invention.

FIG. 13 is a flow chart illustrating a method for performing hill-climbing with branch prediction according to an exemplary embodiment of the present invention. The embodiment illustrated in FIG. 13 includes some of the procedures illustrated in the pseudo code listed above. At 1301, it is determined whether a current pass (i) has reached the maximum number of passes (maxPasses) allowed. According to an embodiment of the present invention, a physical synthesis procedure is set to run up to a maximum number of passes where each pass may be designated by the physical synthesis procedure to perform optimization using a particular strategy. According to an embodiment of the present invention, a strategy may include a specific technique such as incremental retiming, combinational or BDD-based resynthesis, logic replication, local rewiring, or other techniques. A strategy may also include a particular direction taken by one of the techniques listed above or other techniques. If the maximum number of passes has been reached, control proceeds to 1313. If the maximum number of passes has not been reached, control proceeds to 1302.

At 1302, it is determined whether a current iteration (j) has reached a maximum number of iterations (maxIters) allowed. According to an embodiment of the present invention, each pass in a physical synthesis procedure is set to run up to a maximum number of iterations. According to an embodiment of the present invention, an iteration may be defined by a number of transformations executed, a period of time of execution, or by other terms. If a pass has reached its maximum number of iterations, control proceeds to 1311. If a pass has not reached its maximum number of iterations, control proceeds to 1303.

At 1303, a determination is made whether one or more additional threads should be spawned. According to an embodiment of the present invention, the determination may be made in response to evaluating a cost function. The cost function may reflect an expected compile time reduction that takes into account a probability of success for an iteration using an optimization strategy of the existing thread, an estimated time to execute an iteration using an optimization strategy of the existing thread, a number of iterations remaining to be performed by the existing thread, a remaining number of hill-climbing iterations allowable for the existing thread, and/or other criteria. If a determination is made to spawn one or more additional threads, control proceeds to 1304. If a determination is made not to spawn one or more additional threads, control proceeds to 1305.

At 1304, one or more additional threads are spawned and runs through each of the procedures in 1301-1313 independently.

At 1305, an optimization strategy is run on an existing netlist for an iteration. The optimization strategy generates a solution in the form of a new netlist.

At 1306, the solution generated from running the optimization strategy is evaluated after the iteration. According to an embodiment of the present invention, the solution is run through a cost function that generates a cost value. The cost function may take into account a parameter that the optimization strategy is targeting. It should be appreciated that the cost function may take into account other criteria as well.

At 1307, it is determined whether the solution generated from running the optimization strategy is an improvement. According to an embodiment of the present invention, the cost value generated for the solution is compared with a cost value generated from a solution prior to running the optimization strategy. If the solution generated from running the optimization strategy is an improvement, control proceeds to 1308. If the solution generated from running the optimization strategy is not an improvement, control increments a counter that tracks a number of hill-climbing iterations have been taken (hillClimbing) and proceeds to 1310.

At 1308, a counter that tracks a number of hill-climbing iterations have been taken is reset to zero.

At 1309, all descendant threads of the currently evaluated thread are terminated.

At 1310, it is determined whether the number of hill-climbing iterations that have been taken exceeds a maximum number of hill-climbing iterations permissible (maxHillClimbing). If the number of hill-climbing iterations have not exceeded the maximum number of hill-climbing iterations permissible, control returns to 1302. If the number of hill-climbing iterations have exceeded the maximum number of hill-climbing iterations permissible, control proceeds to 1311.

At 1311, a change is made to the optimization strategy. The change in optimization strategy is to be applied to the best solution as determined at 1305.

At 1312, the iteration number (j) is reset to 0. Control returns to 1301 where a new next pass is started.

At 1313, control terminates the procedure.

FIGS. 1, 3, 11, and 13 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Figure 14A:
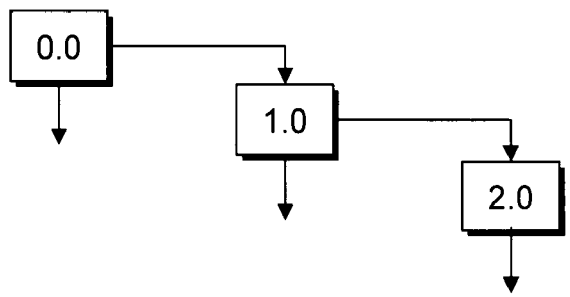
FIG. 14 illustrates an example of parallel hill-climbing according to an exemplary embodiment of the present invention.
Figure 14B:
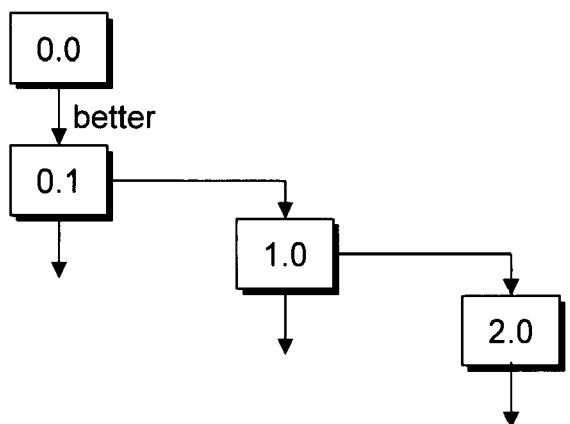
Figure 14C:
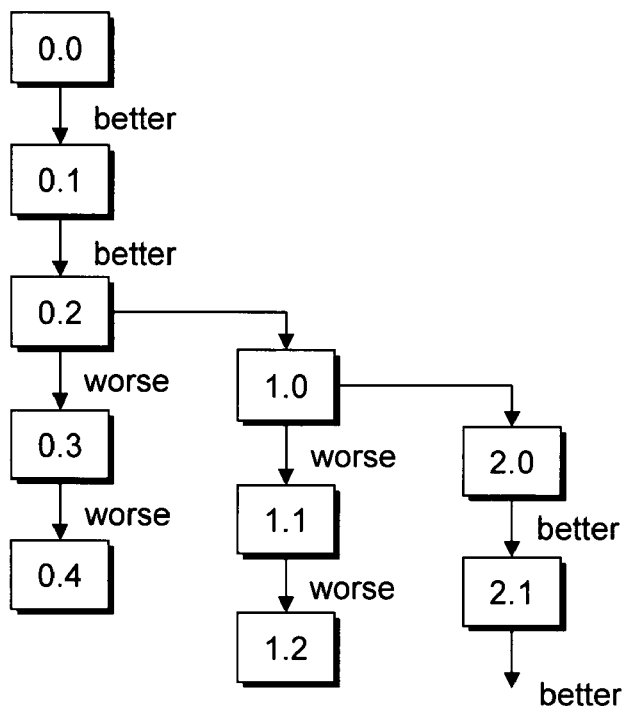

FIGS. 14a-14c illustrate an example of parallel hill-climbing using branch prediction according to an exemplary embodiment of the present invention. When an iteration is run, a parallel thread is spawned running the first iteration of the next pass with the current netlist. In this example, when iteration 0.0 starts, it will also spawn iteration 1.0 in parallel. Iteration 1.0 will then spawn iteration 2.0 as shown in FIG. 14a. This could recursively continue until all available processor resources are used to support additional threads to implement additional passes. In this example, three processors are available. If iteration 0.0 were to enter a series of unsuccessful hill-climbing iterations, it would be unnecessary to restore to netlist 0.0 to run iteration 1.0, because iteration 1.0 is already running (or has already run) on that netlist.

In this example, iteration 0.0 produces a better netlist. The current netlist then becomes the best netlist. All operations performed in parallel on the old netlist become useless and the thread running iterations 1.0 and 2.0 can be terminated. Iteration 0.1 will then spawn a new thread running iteration 1.0 on the new netlist from iteration 0.1 and this will spawn iteration 2.0 as shown in FIG. 14b.

In this example, iteration 0.2 will be the last "good" iteration of the zeroth pass. After iteration 0.4, the maximum number of unsuccessful hill-climbing iterations is reached and the current thread is terminated and replaced with the thread running iteration 1.0. According to an embodiment of the present invention, the thread running the first pass may have progressed. The thread running the first pass may have been terminated and replaced by the thread running the second pass after iterations 1.1 and 1.2 generated unsuccessful solutions as shown in FIG. 14c.

In the example illustrated in FIGS. 14a-14c, a two-iteration deep hill-climbing search was shown. As the depth of this search is allowed to become deeper with greater processor resources, the advantages of aspects of the present invention become even more apparent. When the number of processor resources are limited, threads can be spawned judiciously to optimize the use of compile time. The procedures used in the optimization strategies in physical synthesis hill-climbing can be characterized with a set of parameters as listed below, where the values for some of these parameters are experimentally determined.

| Parameter | Description |
|---|---|
| h | Number of Hill-Climbing Iterations Remaining |
| H | Maximum Number of Hill-Climbing Iterations |
| i | Number of Iterations Remaining |
| I | Maximum Number of Iterations |
| p (h, i) | Probability of Success for One Iteration |
| t (h, i) | Time to Execute an Iteration |

For each proposed thread, the expected compile time reduction of spawning that thread can be computed using the number of iterations remaining, the maximum number of hill-climbing iterations remaining, the probability of success for a particular iteration, and the time to execute an iteration. According to an embodiment of the present invention, parameters are functions of other procedures and p and t are functions of which iterations is currently being executed.

Given a currently running thread Y, the expected compile time reduction of new thread Yn is equal to the expected amount of time before a backtrack occurs on Y. Assuming all sets of parameters are the same and all procedures are the same, the expected reduction of the thread first thread, y1, is given by the following relationship.

$$E(Y1) = \left[\sum_{j=0}^{\text{MIN}(Yh,Yi)} t(Yh-j, Yi-j)\right]\left[\prod_{j=0}^{\text{MIN}(Yh,Yi)} (1 - p(Yh-j, Yi-j))\right]$$

The nth thread only reduces compile time if all n−1 prior threads failed. Therefore, the incremental expected reduction of the nth thread, Yn, is given by the following relationship.

$$E(Yn) = \left[\sum_{j=0}^{\text{MIN}(Yh,Yi)} t(Yh-j, Yi-j) + \sum_{j=0}^{Yh} t(j, j)\right]$$

$$\left[\prod_{j=0}^{\text{MIN}(Yh,Yi)} (1 - p(Yh-j, Yi-j))\right]$$

$$\left[\prod_{j=0}^{Yh} (1 - p(j, j))\right]$$

These calculations determine the expected compile time reduction for spawning a thread. A cost function entailing this estimated savings as well as the estimated overhead cost of spawning and synchronizing a thread can then be used to make a decision on whether or not to spawn the thread.

Figure 15:
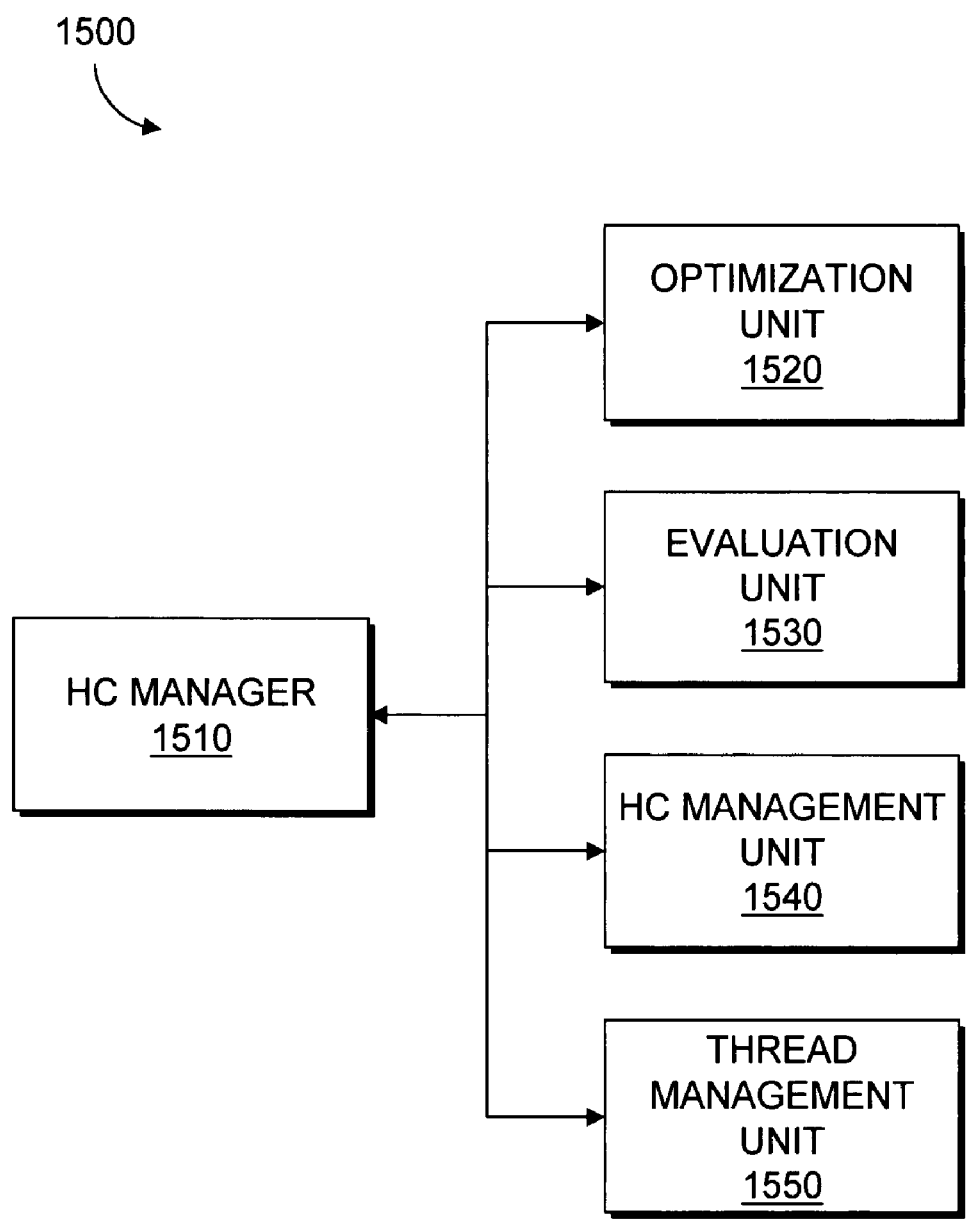
FIG. 15 is a block diagram of a hill-climbing management unit according to an exemplary embodiment of the present invention.

FIG. 15 is a block diagram of a hill-climbing management unit 1500 according to an exemplary embodiment of the present invention. The hill-climbing management unit 1500 may be used to implement the hill-climbing management unit 965 shown in FIG. 9. The hill-climbing unit 1500 includes a hill-climbing (HC) manager 1510. The hill-climbing manager is coupled to and transmits information between the components in the hill-climbing management unit 1500.

The hill-climbing management unit 1500 includes an optimization unit 1520 to perform circuit transformations in a system to optimize the system. The optimization unit 1520 may utilize circuit transformation techniques such as incremental retiming, combinational or binary decision diagram (BDD)-based resynthesis, logic replication, and local rewiring to achieve the goal of reducing the area required for a circuit, reduce the delay of a signal, reduce the power required for a system, improve routability, and/or other goals. The optimization unit 1520 may perform the procedures described with reference to 303 in FIG. 3 and 963 in FIG. 9.

The hill-climbing unit 1500 includes an evaluation unit 1530. The evaluation unit 1530 evaluates a solution generated by the optimization unit. According to an embodiment of the present invention, the evaluation unit 1530 may run a solution through a cost function to compute a cost value. The cost function may take into account a parameter that the optimization strategy is targeting. It should be appreciated that the cost function may take into account other criteria as well. The cost value of a solution may be compared with a cost value associated with a previous best solution.

The hill-climbing unit 1500 includes a hill-climbing management unit 1540. The hill-climbing management unit 1540 directs strategy changes to be utilized by the optimization unit 1520 in response to results from the evaluation unit 1530. According to an embodiment of the present invention, the hill-climbing management unit 1540 may direct a strategy change in response to a number of iterations generating a series of solutions that are not useful.

The hill-climbing unit 1500 includes a thread management unit 1550 to determine when to spawn a descendant thread to run in parallel with an existing thread. The descendant thread would execute a different optimization strategy than the existing thread but on a same netlist as the existing thread. According to an embodiment of the present invention, the thread management unit 1550 spawns the descendant thread in response to a cost function that reflects an expected compile time reduction. The expected compile time reduction may be computed from a probability of success for an iteration using an optimization strategy of the existing thread, an estimated time to execute an iteration using an optimization strategy of the existing thread, a number of iterations remaining to be performed by the existing thread, a remaining number of hill-climbing iterations allowable for the existing thread, and/or other criteria. According to an embodiment of the present invention, the thread management unit 1550 terminates the first descendant thread if the existing thread generates an improved solution after an iteration. The thread management unit 1550 may also terminate a thread when either a maximum number of iterations have been performed by a thread or when the hill-climbing management unit 1540 directs a strategy change to be utilized by the optimization unit.

Embodiments of the present invention have been disclosed with reference to physical synthesis. It should be appreciated, however, that embodiments of the present invention may be performed with any procedure that benefits from hill-climbing.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
synthesizing the system;
mapping the system;
placing the system on the target device;
routing the system; and
performing physical synthesis on the system where a first descendant thread is spawned to run in parallel with an existing thread where the first descendant thread is executing a different optimization strategy than the existing thread but on a same netlist as the existing thread.

2. The method of claim 1, wherein the first descendant thread is spawned in response to evaluating a cost function.

3. The method of claim 2, wherein the cost function reflects an expected compile time reduction.

4. The method of claim 3, wherein the expected compile time reduction is generated from a probability of success for an iteration using an optimization strategy of the existing thread.

5. The method of claim 3, wherein the expected compile time reduction is generated from an estimated time to execute an iteration using an optimization strategy of the existing thread.

6. The method of claim 3, wherein the expected compile time reduction is generated from a number of iterations remaining to be performed by the existing thread.

7. The method of claim 3, wherein the expected compile time reduction is generated from a remaining number of hill-climbing iterations allowable for the existing thread.

8. The method of claim 1, further comprising terminating the first descendant thread if the existing thread generates an improved solution after an iteration.

9. The method of claim 1, further comprising terminating the first descendant thread if the existing thread is terminated.

10. The method of claim 1, further comprising spawning a second descendant thread from the first descendant thread to run in parallel with the first descendant thread where the second descendant thread is executing a different optimization strategy on the same netlist as the existing thread.

11. The method of claim 1, wherein the optimization strategy may include one of incremental retiming, resynthesis, logic replication, and local rewiring.

12. The method of claim 1, wherein performing physical synthesis comprises perform a series of circuit transformations on the system.

13. The method of claim 1, further comprising generating a data file that includes results from performing physical synthesis that may be used by another computer system to program the target device.

14. The method of claim 1, further comprising terminating a thread when either a maximum number of iterations have been performed by the thread or when a strategy change is appropriate.

15. The method of claim 1, further comprising outputting a data file that includes results generated from the physical synthesis.

16. An article of manufacture comprising a machine accessible medium including sequences of instructions, the sequences of instructions including instructions which when executed cause the machine to perform:
    synthesizing the system;
    mapping the system;
    placing the system on the target device;
    routing the system; and
    performing physical synthesis on the system where a descendant thread is spawned to run in parallel with an existing thread where the descendant thread is executing a different optimization strategy than the existing thread but on a same netlist as the existing thread.

17. The article of manufacture of claim 16, wherein the descendant thread is spawned in response to evaluating a cost function.

18. The article of manufacture of claim 17, wherein the cost function reflects an expected compile time reduction.

19. The article of manufacture of claim 18, wherein the expected compile time reduction is estimated from a probability of success for an iteration using an optimization strategy of the existing thread.

20. A hill-climbing management unit, comprising:
    an optimization unit to perform circuit transformations in a system to optimize the system;
    an evaluation unit to evaluate a solution generated by the optimization unit;
    a hill-climbing management unit to direct a strategy change to be utilized by the optimization unit in response to the evaluation unit; and
    a thread management unit to determine when to spawn a descendant thread to run in parallel with an existing thread where the descendant thread is executing a different optimization strategy than the existing thread but on a same netlist as the existing thread.

21. The apparatus of claim 20, wherein the thread management unit spawns the descendant thread in response to a cost function that reflects an expected compile time reduction.

22. The apparatus of claim 21, wherein the expected compile time reduction is estimated from a probability of success for an iteration using an optimization strategy of the existing thread.

23. The apparatus of claim 21, wherein the expected compile time reduction is estimated from an estimated time to execute an iteration using an optimization strategy of the existing thread.

24. The apparatus of claim 21, wherein the expected compile time reduction is estimated from a number of iterations remaining to be performed by the existing thread.

25. The apparatus of claim 21, wherein the expected compile time reduction is estimated from a remaining number of hill-climbing iterations allowable for the existing thread.

26. The apparatus of claim 20, wherein the thread management unit terminates the first descendant thread if the existing thread generates an improved solution after an iteration.

27. The apparatus of claim 20, wherein the thread management unit terminates a thread when either a maximum number of iterations have been performed by a thread or when the hill-climbing management unit directs a strategy change to be utilized by the optimization unit.

\* \* \* \* \*